(12) United States Patent
Kawashima

(10) Patent No.: US 7,158,910 B2
(45) Date of Patent: Jan. 2, 2007

(54) DEVICE FOR CALCULATING THE QUANTITY OF LIGHT AND METHOD THEREOF

(75) Inventor: Isamu Kawashima, Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 49 days.

(21) Appl. No.: 10/889,673

(22) Filed: Jul. 12, 2004

(65) Prior Publication Data

US 2005/0027490 A1    Feb. 3, 2005

(30) Foreign Application Priority Data

Jul. 15, 2003    (JP) ............................. 2003-197218

(51) Int. Cl.
*G01D 1/00* (2006.01)
*H01L 21/00* (2006.01)
*H01L 21/66* (2006.01)
*B32B 41/00* (2006.01)

(52) U.S. Cl. ............................ 702/127; 438/7; 438/16; 156/378

(58) Field of Classification Search ................ 702/127; 438/7, 16
See application file for complete search history.

(56) References Cited

U.S. PATENT DOCUMENTS

| 4,718,967 | A | | 1/1988 | Irie | |
| 5,281,473 | A | * | 1/1994 | Ishiwata et al. | ............. 428/345 |
| 5,332,406 | A | | 7/1994 | Takeuchi et al. | |
| 6,258,426 | B1 | * | 7/2001 | Yamamoto et al. | ......... 428/40.1 |

FOREIGN PATENT DOCUMENTS

| GB | 2 307 759 | 6/1997 |
| JP | 7-183365 | 7/1995 |
| JP | 9-162141 | 6/1997 |
| JP | 10-27836 | 1/1998 |
| JP | 10-284564 | 10/1998 |

OTHER PUBLICATIONS

Patent Abstract of Japan, Publication No. 07183365 A, Published on Jul. 21, 1995, in the name of Akatani.
Patent Abstract of Japan, Publication No. 10027836 A, Published on Jan. 27, 1998, in the name of Yamanaka.

(Continued)

*Primary Examiner*—Marc S. Hoff
*Assistant Examiner*—Janet L Suglo
(74) *Attorney, Agent, or Firm*—Christie, Parker & Hale LLP

(57) ABSTRACT

A method of calculating a quantity of light by measuring, by using an adhering force measuring unit (71), the adhering force of an ultraviolet light-curable tape (11 or 21) relying upon the quantity of ultraviolet light with which the ultraviolet light-curable tape is irradiated from an ultraviolet light irradiation unit (61), and calculating, by using a calculation unit, the quantity of ultraviolet light corresponding to a predetermined adhering force, from the measured adhering force of the ultraviolet light-curable tape, and a device therefor. The predetermined adhering force may have been stored in advance in the storage unit or the predetermined adhering force may be determined in advance relying upon at least either one of the kind of the ultraviolet light-curable tape or the elapsed time of the ultraviolet light-curable tape. Then, the quantity of light necessary for the ultraviolet light-curable tape that is used is automatically calculated to avoid a problem caused by an insufficient quantity of light or an excess quantity of light.

4 Claims, 5 Drawing Sheets

OTHER PUBLICATIONS

Patent Abstract of Japan, Publication No. 10284564A, Published on Oct. 23, 1998, in the name of Hasegawa.

European Search Report for Application No. 04254154.0, dated Oct. 14, 2004, in the name of Tokyo Seimitsu Co., Ltd.

Patent Abstracts of Japan for Publication No. 09162141, Date of publication of application Jun. 20, 1997, in the name of Hiichi Irie.

Korean Office action, dated Feb. 20, 2006, for Application No. 10-2004-0055291 including English Translation, 5pp.

* cited by examiner

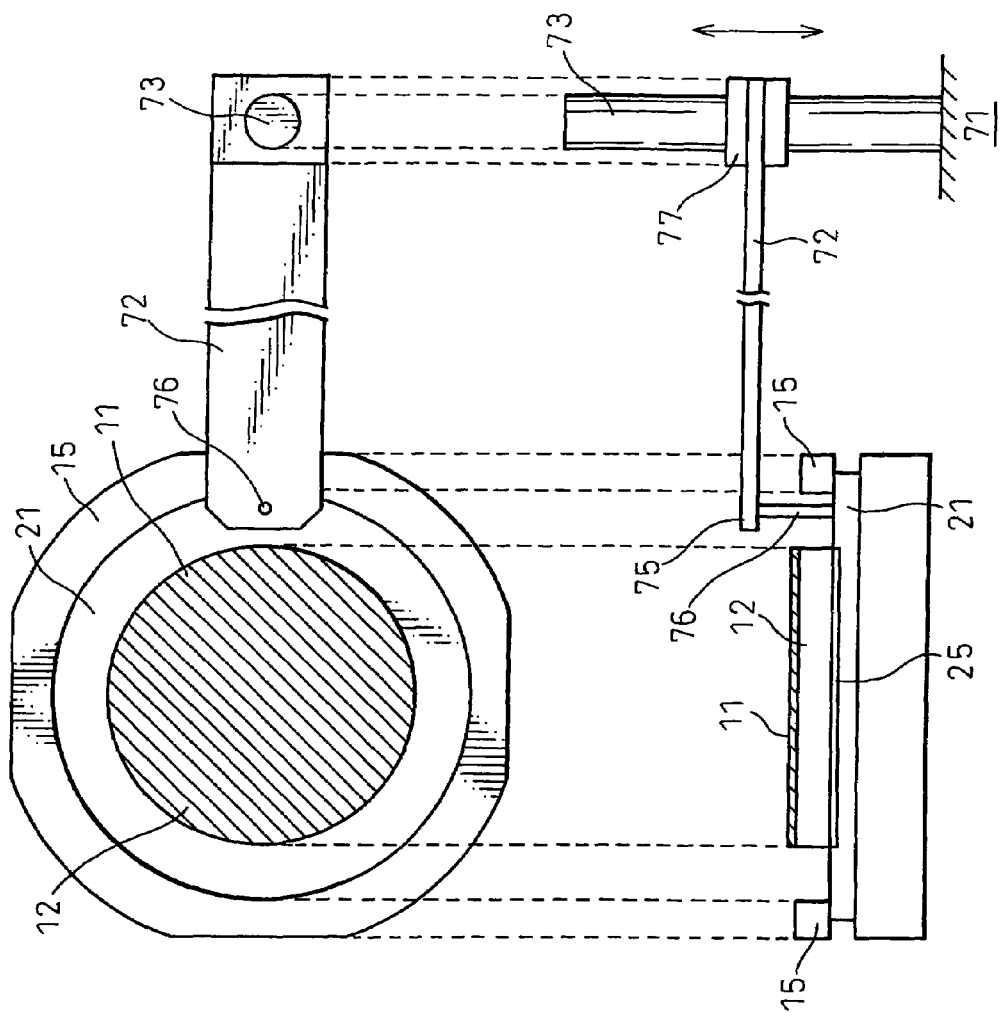

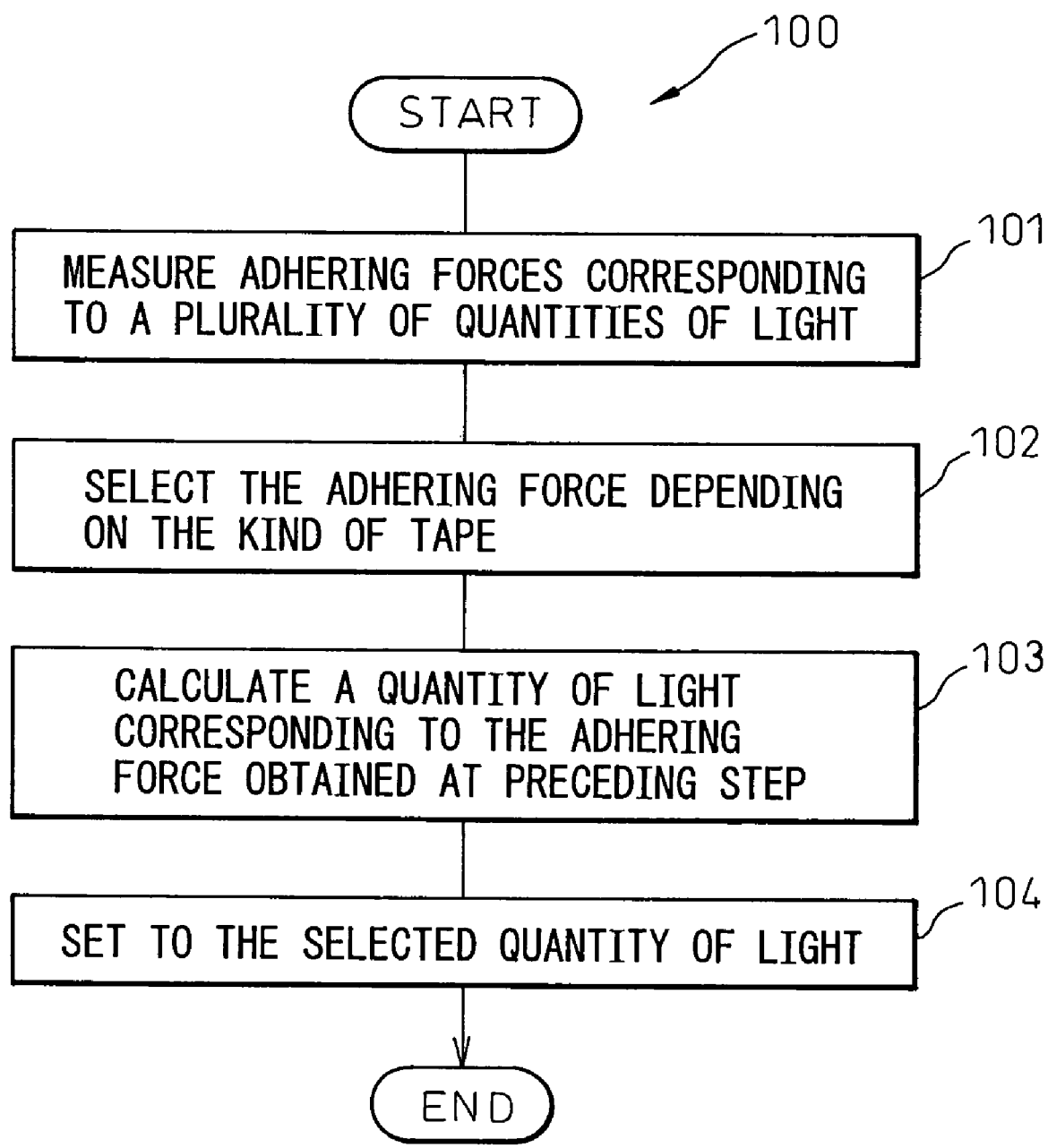

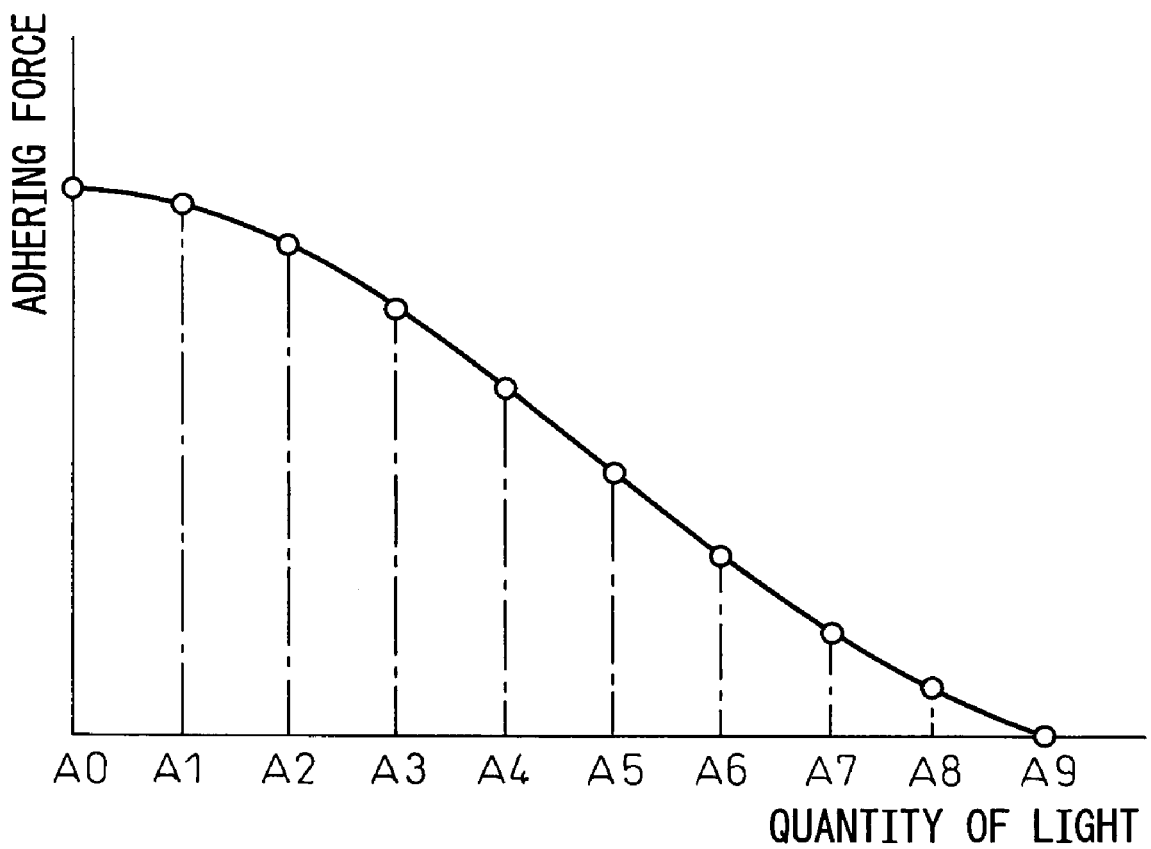

Fig.5a

|    | $D_1$ | $D_2$ | -------- | $D_n$ |
|----|-------|-------|----------|-------|
| $T_1$ | $F_{11}$ | $F_{12}$ | -------- | $F_{1n}$ |
| $T_2$ | $F_{21}$ | | | |
| ⋮ | ⋮ | | | ⋮ |
| $T_m$ | $F_{m1}$ | -------- | -------- | $F_{mn}$ |

Fig.5b

|    | $P_1$ | $P_2$ | -------- | $P_n$ |
|----|-------|-------|----------|-------|
| $T_1$ | $F_{11}$ | $F_{12}$ | -------- | $F_{1n}$ |
| $T_2$ | $F_{21}$ | | | |
| ⋮ | ⋮ | | | ⋮ |
| $T_m$ | $F_{m1}$ | -------- | -------- | $F_{mn}$ |

…
DEVICE FOR CALCULATING THE QUANTITY OF LIGHT AND METHOD THEREOF

CROSS REFERENCE TO RELATED APPLICATION

This application claims priority of Japanese Patent Application Number 2003-197218, filed on Jul. 15, 2003.

BACKGROUND OF THE INVENTION

1. Field of the Invention

This invention relates to a device for calculating the quantity of light and, particularly, to a device for calculating the quantity of light used when an ultraviolet light-curable tape stuck to one surface of a wafer is irradiated with ultraviolet light.

2. Description of the Related Art

In the field of semiconductor production, the sizes of wafers are increasing year after year and, besides, the thickness of the wafers is decreasing to increase the mounting density. To conduct the back-grinding which is for grinding the back surface of the semiconductor wafer for decreasing the thickness of the wafer, a surface protection tape is stuck to the front surface of the wafer for protecting the semiconductor elements formed on the front surface of the wafer. The surface protection tape is peeled off after the back-grinding. If the surface protection tape has a relatively large adhering force at the time of peeling, however, it is probable that the wafer itself is damaged being pulled by the surface protection tape and, besides, the adhesive of the surface protection tape partly remains on the surface of the wafer. In recent years, therefore, there has been used, as a surface protection tape, a tape (hereinafter referred to as "ultraviolet light-curable tape") of which the adhesive is cured by the irradiation with ultraviolet light (hereinafter often referred to as "UV") to exhibit a decreased adhering force. During the back-grinding, the surface protection tape exhibits a sufficiently large adhering force as it has not been irradiated with ultraviolet light. After the back-grinding, however, the adhering force is lowered by the irradiation with ultraviolet light. This makes it possible to easily peel the surface protection tape off the wafer without damaging the wafer and without leaving the adhesive thereon.

The wafer having semiconductor elements formed on the surface thereof is finally cut into dices by dicing. At the time of dicing, the wafer is integrated with a frame by using a dicing tape stuck to the back surface of the wafer. Then, the wafer is cut together with the dicing tape (in the case of a full cut) by using a dicing blade of a dicing device. However, a problem in that the adhesive of the dicing tape sticks to the blade causing the clogging and damaging the semiconductor elements occurs. Therefore, it has been attempted to avoid the above problem by using an ultraviolet light-curable tape as the dicing tape, and lowering the adhering force by curing the dicing tape, to some extent, by irradiation with the ultraviolet light prior to dicing. In this case, irradiation with an excess of ultraviolet light results in a great reduction in the adhering force which may permit the die to be scattered at the time of dicing. Therefore, the dicing tape is irradiated with ultraviolet light of which the quantity is limited to some extent (see, for example, Japanese Unexamined Patent Publication (Kokai) Nos. 10-27836, 10-284564 and 7-183365).

However, the ultraviolet light-curable tape exhibits adhering force that varies depending upon the kind of the tape, and it is difficult to determine a proper quantity of ultraviolet light. In particular, the adhering force of the ultraviolet light-curable tape may vary depending upon the production lot and the elapsed time. In such a case, the quantity of ultraviolet light is determined relying solely upon the operator's experience and can seriously affecting the yield.

That is, when the quantity of light is insufficient while using, for example, the ultraviolet light-curable tape as the surface protection tape, the above-mentioned problem of breakage of the wafer and the residence of the adhesive occurs. When the quantity of light is insufficient while using, for example, the ultraviolet light-curable tape as the dicing tape, there occurs the problem in that the adhesive of the dicing tape sticks to the blade as described above. Further, when the quantity of light is excessive, while using, for example, the ultraviolet light-curable tape as the dicing tape, the adhering force drops and a die scatters at the time of dicing.

The present invention was accomplished in view of the above circumstances and has an object of providing a device for calculating the quantity of light to automatically calculate the quantity of light needed for the ultraviolet light-curable tape while avoiding the problems caused by an insufficient quantity of light or an excess quantity of light.

SUMMARY OF THE INVENTION

In order to achieve the above object according to an embodiment of the present invention, there is provided a device for calculating the quantity of light, comprising: an ultraviolet light irradiation means in which ultraviolet light are irradiated; an adhering force measuring means in which the adhering force of an ultraviolet light-curable tape is measured; and a calculation means in which the quantity of ultraviolet light corresponding to a predetermined adhering force is calculated from the adhering force of the ultraviolet light-curable tape measured by the adhering force measuring means depending upon the quantity of ultraviolet light with which the ultraviolet light-curable tape is irradiated by the ultraviolet light irradiation unit.

Namely, the embodiment of the invention makes it possible to calculate the quantity of light corresponding to a desired adhering force based on a relationship between the quantity of light and the adhering force and, hence, to automatically calculate the quantity of light necessary for the ultraviolet light-curable tape while avoiding the problem caused by an insufficient quantity of light or an excess quantity of light, enabling the productivity to be enhanced. The ultraviolet light-curable tape is, for example, the surface protection tape or the dicing tape. The device for calculating the quantity of light of the present invention can be used for both tapes.

BRIEF DESCRIPTION OF THE DRAWINGS

FIG. 2a is a top view illustrating a portion of the device for calculating the quantity of light based on the invention;

FIG. 2b is a side sectional view illustrating a portion of the device for calculating the quantity of light based on the invention;

FIG. 3 is a flowchart of a program executed by a unit for calculating the quantity of light;

FIG. 4 is a diagram illustrating a relationship between the quantity of light and the adhering force;

FIG. 5a is a map illustrating a relationship between a dicing tape and the elapsed time; and FIG. 5b is a map illustrating a relationship between the surface protection tape and the elapsed time.

DESCRIPTION OF THE PREFERRED EMBODIMENTS

Figure 1:
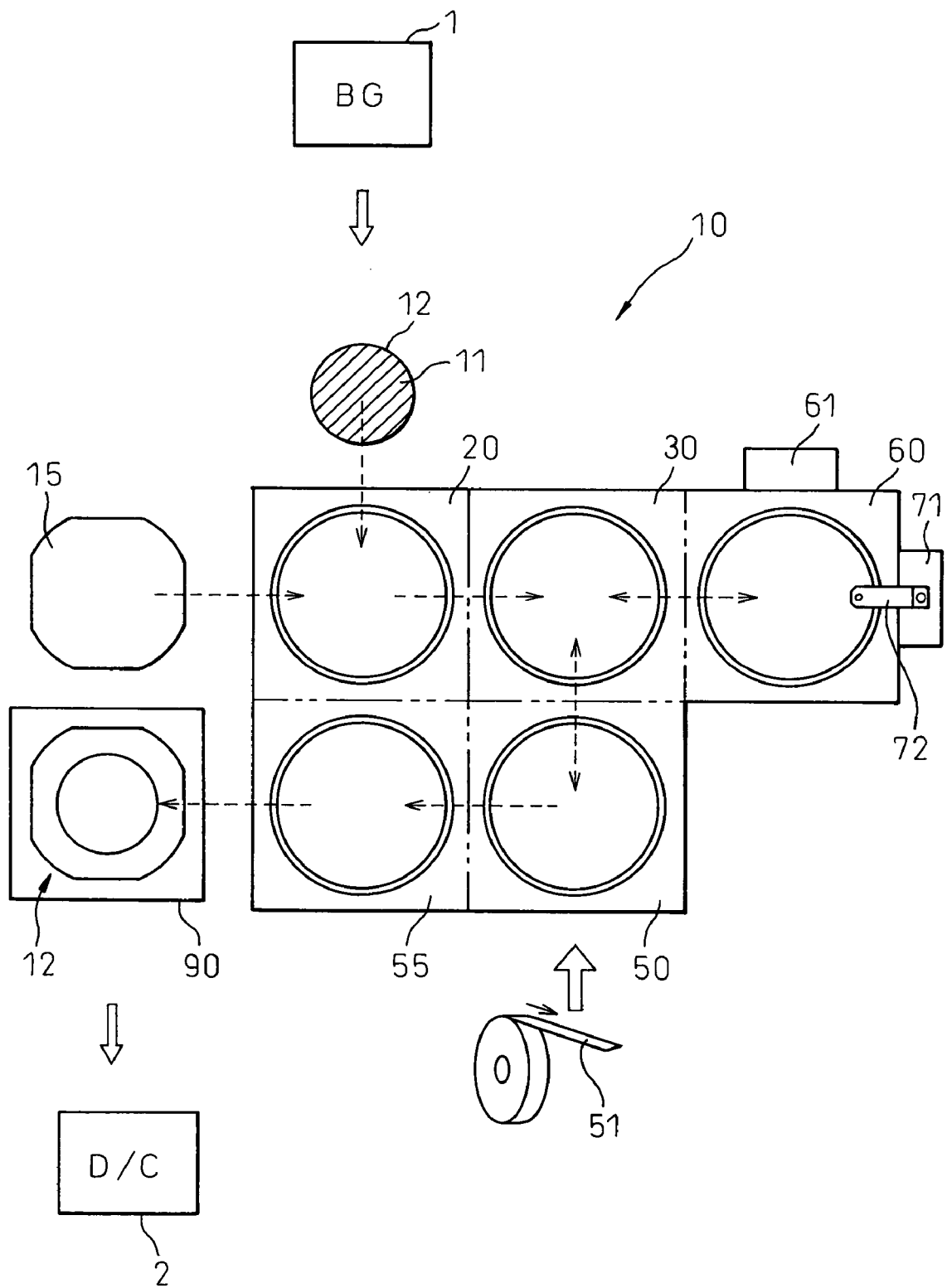
FIG. 1 is a view schematically illustrating a wafer treating apparatus including a device for calculating the quantity of light based on the invention.

An embodiment of the invention will now be described with reference to the accompanying drawings. In the following drawings, the same members are denoted by the same reference numerals. For easy comprehension, the scales of these drawings are suitably changed.

FIG. 1 is a view schematically illustrating an apparatus for treating wafers including a device for calculating the quantity of light based on the present invention, FIG. 2a is a top view illustrating a portion of the device for calculating the quantity of light based on the invention, and FIG. 2b is a side sectional view illustrating a portion of the device for calculating the quantity of light based on the invention. Referring to FIG. 1, a wafer of which the back surface is ground by a back grinder (BG) 1 is fed to the apparatus 10 for treating wafers. At the time of grinding the back surface of the wafer, the front surface of the wafer is adsorbed. Therefore, a surface protection tape 11 is stuck to the front surface of the wafer 12 in advance (see FIGS. 2b).

Referring to FIG. 1, the wafer treating apparatus 10 includes a mounting unit 20 for mounting a frame 15 on the wafer 12. The wafer 12 having the surface protection tape 11 stuck to the front surface thereof and to be ground on the back surface thereof by the back grinder 1, is fed into the mounting unit 20 by a loader that is not illustrated. Another loader that is not illustrated feeds the frame 15 into the mounting unit 20. In the mounting unit 20, a dicing tape 21 is stuck to the back surface of the wafer 12, and the frame 15 is mounted on the wafer 12 (see FIG. 2b). Finally, the dicing tape 21 is cut depending upon the shape of the frame 15. The wafer 12 of which the back surface is ground by the back grinder 1 has a decreased thickness and is, hence, handled with difficulty. However, the wafer 12 that is mounted on the frame 15 as described above can be easily handled in the subsequent steps.

Here, a die attach film tape (DAF tape) can be stuck to the back surface of the wafer 12 prior to sticking the dicing tape 21 to the wafer 12. At the time of die bonding after the dicing, the DAF tape functions as an adhesive on the bottom surface of the die. Referring to FIG. 2b, further, there may be used the dicing tape 21 provided in advance with the die attach film 25 (DAF) of a shape nearly the same as that of the wafer 12. While simply called dicing tape 21, hereinafter, it should be noted that the die attach film 25, too, is included unless stated otherwise.

The wafer treating apparatus 10 includes an inverting unit 30 for inverting the wafer 12. The wafer 12 mounted on the frame 15 is moved onto the inverting unit 30 which turns the wafer 12 upside down. The wafer 12 may simply pass through the inverting unit 30 without being turned upside down as a matter of course.

The wafer treating apparatus 10 further includes a unit 60 for calculating the quantity of light. The unit 60 for calculating the quantity of light includes a UV lamp 61 which projects ultraviolet light onto one surface of the wafer 12. As shown, the unit 60 for calculating the quantity of light further includes an adhering force measuring unit 71 provided with a plate 72 for carrying a contactor 76 (not shown in FIG. 1). Referring to FIGS. 2a and 2b, a sleeve 77 is provided at a proximal end of the plate 72, and the contactor 76 is carried at a distal end of the plate 72 to extend downward. The sleeve 77 is inserted a cylindrical portion 73 protruding from the top surface of the adhering force measuring portion 71. Being driven by a drive unit, not shown, such as a motor, the plate 72 moves up and down together with the sleeve 77 along the cylindrical portion 73.

Although ultraviolet light in this embodiment is measured at the irradiation position, of the ultraviolet light, it is also possible to obtain a true quantity of the ultraviolet light irradiated onto the dicing tape 21 by measuring the quantity of the ultraviolet light from the UV lamp 61 at any position in the unit 60 for calculating the quantity of light and suitably converting the measured quantity of light.

Reverting to FIG. 1, the wafer treating apparatus 10 further includes a peeling unit 50 for peeling the surface protection tape 11. At the time of peeling, the wafer 12 is so arranged on the peeling unit 50 that the surface to which the surface protection tape 11 has been stuck faces upward. A peeling tape 51 of a relatively narrow width arranged in advance on the peeling unit 50 is attached to the surface protection tape 11 near one edge of the wafer 12. Then, the peeling tape 51 is pulled toward the edge on the opposite side of the wafer 12, whereby the surface protection tape 11 is gradually peeled off from one end. Finally, the whole surface protection tape 11 is peeled off the wafer 12.

Referring to FIG. 1, an enclosing unit 90 is arranged near the left lower position of the wafer treating apparatus 10, and the water 12 treated as desired by the wafer treating apparatus 10 is contained in a cassette. At this time, the wafer 12 from the peeling unit 50 passes through a passage unit 55. The wafer 12 is not given any particular treatment through the passage unit 55. Therefore, the passage unit 55 may be omitted.

As indicated by dotted arrows in FIG. 1, the wafer 12 is moved from the mounting unit 20 to the inverting unit 30 and is, further, moved from the peeling unit 50 to the enclosing unit 90. Further, the wafer 12 is moved between the inverting unit 30 and the unit 60 for calculating the quantity of light, and between the inverting unit 30 and the peeling unit 50. To move the wafer 12 as described above, there is used a moving device such as a robot arm, or the like, which is a general device and is not diagramed or illustrated here.

FIG. 3 is a flowchart of a program executed by the unit for calculating the quantity of light. At step 101 of the program 100 illustrated in FIG. 3, the adhering force of the tape is measured by using the adhering force measuring unit 71 of the unit 60 for calculating the quantity of light. The tape measured in this case is an ultraviolet light-curable tape which is cured and of which the adhering force decreases by the irradiation with ultraviolet light. Therefore, if curable with ultraviolet light, the tape to be measured may be either the surface protection tape 11 that is to be stuck to the front surface of the wafer 12 or the dicing tape 21 that is to be stuck to the back surface thereof.

Described below with reference to FIGS. 2a and 2b is the adhering force measuring unit 71 for measuring the adhering force of the dicing tape 21 stuck to the back surface of the wafer 12. The dicing tape 21 after having been stuck is annularly exposed between the surface protection tape 11 of the wafer 12 and the frame 15. The plate 72 is lowered along the cylindrical portion 73 until the contactor 76 provided at the distal end 75 of the plate 72 comes in contact with the dicing tape 21 as shown. The dicing tape 21 has an adhering force of a certain value, and the contactor 76 sticks to the dicing tape 21. Then, the contactor 76 is further lowered to exert a predetermined force and, then, the plate 72 is raised along the cylindrical portion 73 to peel the contactor 76 off the dicing tape 21. The adhering force of just before the contactor 76 is detatched from the dicing tape 21 is measured by an adhering force calculation unit (not illustrated) in the adhering force measuring unit 71. In mass production, the first wafer 12 and the tapes 11, 21 stuck thereto of each lot may be used as a dummy sample to measure the adhering force in a manner as described above. Or, a wafer to which the tapes of the same conditions are stuck may be prepared as a dummy sample to measure the adhering force of the dummy sample.

Next, ultraviolet light are projected to a predetermined quantity from a UV lamp 61 that is not illustrated in FIGS. 2a and 2b. Next, the adhering force of the dicing tape 21 irradiated with the predetermined quantity of light is measured again by using the contactor 76 of the adhering force measuring unit 71. The dicing tape 21 is further irradiated with a predetermined quantity of ultraviolet light to measure again the adhering force at this moment. By repeating this operation, there is obtained a relationship of the adhering forces of the dicing tape 21 for a plurality of quantities of ultraviolet light. In FIGS. 2a and 2b, the adhering force of the dicing tape 21, between the surface protection tape 11 and the frame 15, is measured. It is, however, also allowable to measure the adhering force of the dicing tape 21 on the back surface of the wafer 12 by inverting the wafer 12 together with the frame 15 by using the inverting unit 30. To measure the adhering force of the surface protection tape 11, further, the surface protection tape 11 is brought close to the adhering force measuring unit 71 or there is used the adhering force measuring unit 71 provided with a plate 72 that can be stretched. In the case of the surface protection tape 11, too, the adhering force is measured by the adhering force measuring unit 71 in nearly the same manner as the one described above.

FIG. 4 is a diagram illustrating a relationship between the quantity of light and the adhering force. As described above, the tape that is measured is curable with ultraviolet light and, hence, exhibits the greatest adhering force at A0 where the quantity of light is 0 and exhibits an adhering force which gradually decreases with an increase in the quantity of light as A1, A2, - - - . In the relationship between the quantity of light and the adhering force illustrated in FIG. 4, the tape exhibits a minimum adhering force when the quantity of light is A9. In FIG. 4, the quantity of light irradiated remains constant for one time of irradiation operation. In a portion where the adhering force undergoes a large change, however, the quantity of ultraviolet light in one time of irradiation operation may be decreased to increase the precision of measurement. It is further allowable to irradiate a predetermined quantity of ultraviolet light by setting the intensity of ultraviolet light and the time to be constant, or to change the intensity of ultraviolet light and the time to obtain a predetermined quantity of light.

Next, the adhering force is determined depending upon the kind of the tape measured etc. at step 102 in the program 100. Referring to FIG. 5a, the adhering forces to be determined at the time of measuring the dicing tape 21 have been stored in advance in a storage unit (not shown) in the adhering force measuring unit 71, such as ROM or RAM, in the form of a map of functions of a plurality of kinds of dicing tapes 21 ($D_1$ to $D_n$) and elapsed times ($T_1$ to $T_m$) Here, the elapsed time stands for a time after the tape is taken out from a cold and dark place when the tape must be preserved in the cold and dark place, or the passage of time after the production when the tape need not be preserved in a cold and dark place. The adhering forces of the dicing tape 21 in the map are such that the adhesive of the dicing tape 21 is not stuck to the blade of the dicing device to cause clogging and that the dies cut by dicing are not scattered from the dicing tape 21. Similarly, as illustrated in FIG. 5b, the adhering forces to be determined when the surface protection tape 11 is to be used are stored in advance in the storage unit (not shown) of the storing force measuring unit 71 in the form of a map as functions of a plurality of kinds of surface protection tapes 11 ($P_1$ to $P_n$) and the elapsed times ($T_1$ to $T_m$) The adhering force of the surface protection tape 11 in the map is an upper limit value of the adhering force with which the surface protection tape 11 can be peeled off without pulling the wafer 12. Though FIGS. 5a and 5b illustrate adhering forces in a relationship between the tape and the elapsed time, the storage similarly stores a plurality of maps of relationships relative to other parameters such as lot numbers or the kinds of tapes stuck to the opposite surfaces. At step 102, predetermined adhering forces ($F_{11}$ to $F_{mn}$) are selected from the kind of the dicing tape to be measured and the elapsed time. The wafer 12, or the frame 15 itself, or a cassette enclosing the wafers 12 in a unit of a lot, usually has an ID, i.e., an identification mark. It is, therefore, preferable that the kind of the tape and/or the elapsed time are incorporated in the ID in advance. In this case, the ID of the wafer 12, frame 15 or cassette is read out by a particular reader (not illustrated) in the unit 60 for calculating the quantity of light thereby to automatically select the adhering force depending upon the kind of the tape incorporated in the ID. In the present invention, the required adhering force that has been determined in advance is stored in the storage unit, and there is no need to input the required adhering force every time, on the site.

Then, at step 103, the quantities of light corresponding to predetermined adhering forces ($F_{11}$ to $F_{mn}$) obtained at step 102 are calculated by a calculation unit (not shown) in the unit 60 for calculating the quantity of light from the relationship between the quantity of light and the adhering force found at step 101. In this case, a function of the adhering force to the quantity of light is calculated and, then, the quantities of light corresponding to the above predetermined adhering forces ($F_{11}$ to $F_{mn}$) are calculated from the function. If the adhering force selected at step 102 is equal to the adhering force measured at step 101, the quantity of light corresponding to the adhering force may be selected without calculating the function of the adhering force to the quantity of light.

At step 104, the quantity of ultraviolet light irradiated by the UV lamp 61 is set to the quantity of light calculated or selected at step 103 to end the routine. With the thus set quantity of light, the production is conducted on the basis of a mass production lot after the end of the program 100. This holds true in the case of the surface protection tape 11, too.

In the invention as described above, the quantity of light corresponding to a desired adhering force is calculated based on a relationship between the quantity of light and the adhering force. Therefore, the quantity of light required for the ultraviolet light-curable tape that is used can be automatically calculated to avoid the problem caused by an insufficient quantity of light or an excess quantity of light and, as a result, the productivity can be enhanced. When it is assumed that the surface protection tape 11 is irradiated with ultraviolet light, it is easy to avoid the problem that the wafer is pulled and damaged at the time of peeling off the surface protection tape 11. When it is assumed that the dicing tape 21 is irradiated with ultraviolet light, the adhesive of the dicing tape 21 does not stick to clog the blade of the dicing device 2 (see FIG. 1), and the dies cut by dicing are not scattered from the dicing tape 21.

The device for calculating the quantity of light of the invention may be so constituted as to include the mounting unit 20 and the inverting unit 30 or the peeling unit 50, as a matter of course. Further, reversing the order of step 101 and step 102 of the program 100 is encompassed in the scope of the invention.

The invention exhibits the effect that the quantity of light necessary for the ultraviolet light-curable tape that is used is automatically calculated avoiding a problem caused by an insufficient quantity of light or an excess quantity of light.

The invention claimed is:

1. A method for irradiating a calculated quantity of light on an ultraviolet light-curable tape, the method comprising:
   obtaining a relationship of a plurality of adhering forces of the tape with the quantity of light for a plurality of quantities of the light;
   selecting an adhering force corresponding to a kind of the tape and an elapsed time associated with the tape;
   calculating a quantity of light to be irradiated, corresponding to the selected adhering force utilizing the relationship of the plurality of adhering forces of the tape for the plurality of quantities of light; and
   irradiating the calculated quantity of light on the ultraviolet light-curable tape.

2. The method of claim 1, further comprising storing the kind of the tape and the elapsed time associated with the tape in advance.

3. A device for irradiating a calculated quantity of light on an ultraviolet light-curable tape comprising:
   means for obtaining a relationship of a plurality of adhering forces of the tape with the quantity of light for a plurality of quantities of the light;
   means for selecting an adhering force corresponding to a kind of the tape and an elapsed time associated with the tape;
   means for calculating a quantity of light to be irradiated, corresponding to the selected adhering force utilizing the relationship of the plurality of adhering forces of the tape for the plurality of quantities of light; and
   means for irradiating the calculated quantity of light on the ultraviolet light-curable tape.

4. The device of claim 3, further comprising means for storing the kind of the tape and the elapsed time associated with the tape in advance.

\* \* \* \* \*